United States Patent
Tanaka

(10) Patent No.: US 9,055,661 B2
(45) Date of Patent: Jun. 9, 2015

(54) PLASMA PROCESSING APPARATUS

(71) Applicant: Tokyo Electron Limited, Tokyo (JP)

(72) Inventor: Kiyoshi Tanaka, Miygai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 331 days.

(21) Appl. No.: 13/743,586

(22) Filed: Jan. 17, 2013

(65) Prior Publication Data

US 2013/0206338 A1  Aug. 15, 2013

Related U.S. Application Data

(60) Provisional application No. 61/592,688, filed on Jan. 31, 2012.

(30) Foreign Application Priority Data

Jan. 20, 2012  (JP) ................ 2012-010445

(51) Int. Cl.
| | |
|---|---|
| C23C 16/50 | (2006.01) |
| C23C 16/503 | (2006.01) |
| H01L 21/306 | (2006.01) |
| H05H 1/46 | (2006.01) |
| H01J 37/32 | (2006.01) |
| C23F 1/00 | (2006.01) |

(52) U.S. Cl.
CPC .............. H05H 1/46 (2013.01); C23C 16/50 (2013.01); C23C 16/503 (2013.01); H01J 37/32449 (2013.01); H01J 37/32568 (2013.01)

(58) Field of Classification Search
CPC .............. C23C 16/50; C23C 16/503
USPC ........ 118/723 E; 156/345.43, 345.44, 345.45
See application file for complete search history.

(56) References Cited

U.S. PATENT DOCUMENTS

| | | | | |
|---|---|---|---|---|
| 6,048,435 | A  * | 4/2000 | DeOrnellas et al. ..... | 156/345.44 |
| 6,108,189 | A  * | 8/2000 | Weldon et al. ................ | 361/234 |
| 6,334,983 | B1 * | 1/2002 | Okayama et al. ......... | 422/186.29 |
| 7,712,435 | B2 * | 5/2010 | Yoshizaki et al. ........ | 118/723 E |
| 7,988,816 | B2 * | 8/2011 | Koshiishi et al. ........ | 156/345.47 |
| 8,069,817 | B2 * | 12/2011 | Fischer et al. ............ | 118/723 E |
| 8,216,433 | B2 * | 7/2012 | Yonesu .................... | 204/157.43 |
| 8,778,079 | B2 * | 7/2014 | Begarney et al. ............. | 118/715 |
| 2011/0049102 | A1 * | 3/2011 | Kroll et al. ...................... | 216/71 |
| 2012/0247673 | A1 * | 10/2012 | Hayashi et al. .......... | 156/345.33 |
| 2014/0083362 | A1 * | 3/2014 | Lubomirsky et al. ..... | 118/723 E |

FOREIGN PATENT DOCUMENTS

JP  2010-219491 A  9/2010

* cited by examiner

*Primary Examiner* — Rudy Zervigon
(74) *Attorney, Agent, or Firm* — Pearne & Gordon LLP

(57) ABSTRACT

A plasma processing apparatus comprises an upper electrode 42, a lower electrode, a grounding member 61 provided above the upper electrode 42 via an insulating member 60; and a DC power supply for applying a DC voltage to the upper electrode 42. Gas diffusion rooms 54 and 55 communicating with a gas supply opening 53 formed at a lower surface of the upper electrode 42 are formed in the upper electrode 42 and a gas flow path 62 communicating with the gas diffusion rooms 54 and 55 is formed in the insulating member 60. A bent portion 63 for allowing a gas within the gas flow path to flow in a direction having at least a horizontal component is formed at the gas flow path 62 such that an end of the gas flow path 62 cannot be seen from the other end thereof when viewed from the top.

7 Claims, 5 Drawing Sheets

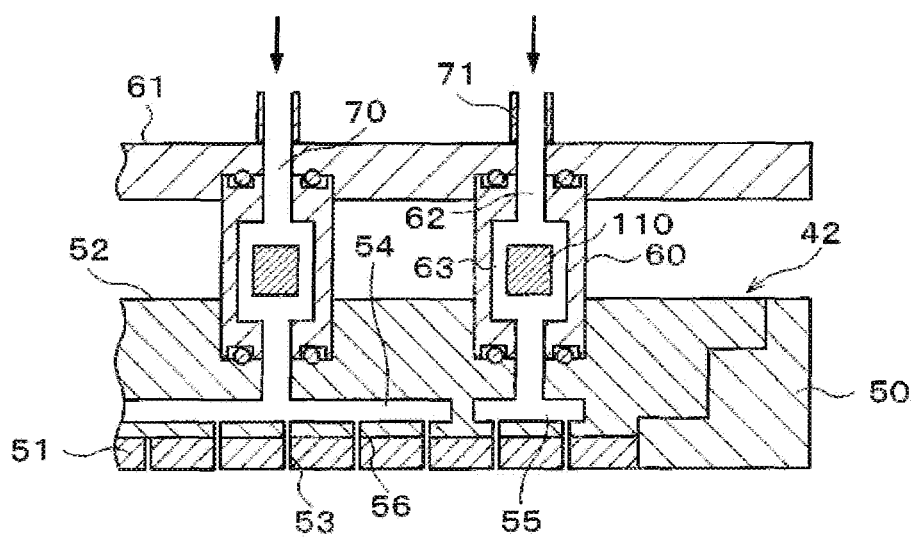
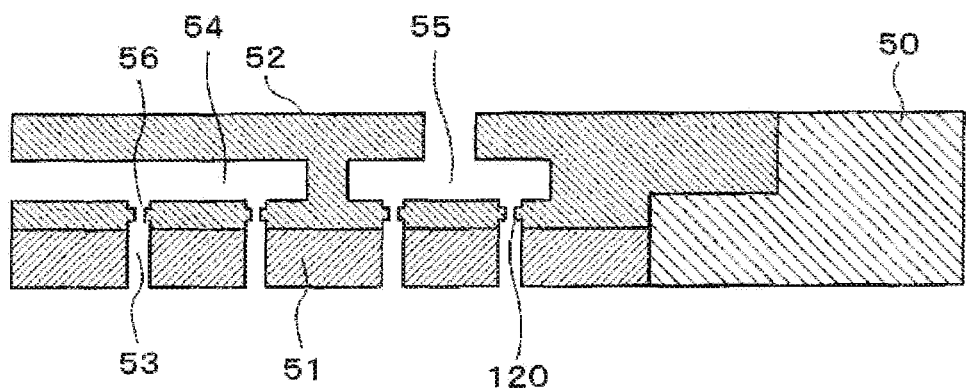
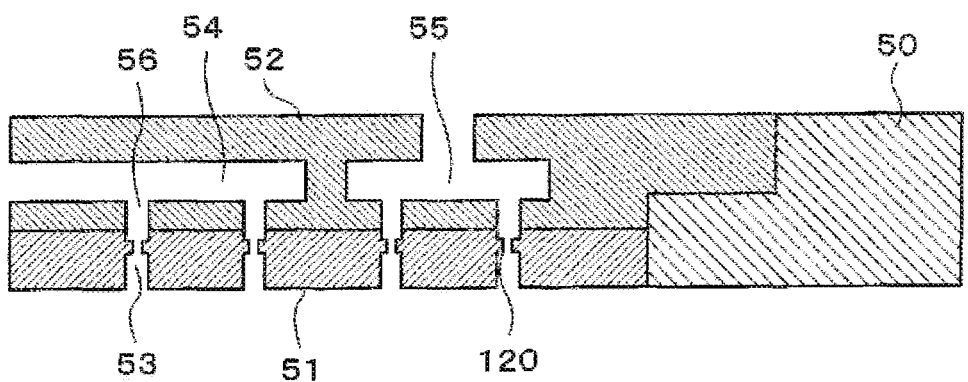

PLASMA PROCESSING APPARATUS

CROSS-REFERENCE TO RELATED APPLICATION

This application claims the benefit of Japanese Patent Application No. 2012-010445 filed on Jan. 20, 2012, and U.S. Provisional Application Ser. No. 61/592,688 filed on Jan. 31, 2012, the entire disclosures of which are incorporated herein by reference.

FIELD OF THE INVENTION

The present disclosure relates to a plasma processing apparatus that performs a plasma process on a target object.

BACKGROUND OF THE INVENTION

A parallel plate type (capacitively coupled) plasma processing apparatus, an inductively coupled plasma processing apparatus, a microwave plasma processing apparatus or the like has been widely used for performing a microprocess such as an etching process or a film forming process on a target object such as a semiconductor wafer (hereinafter, referred to as "wafer") by plasma.

Particularly, in the parallel plate type plasma processing apparatus, a high frequency power is applied to at least one of an upper electrode and a lower electrode provided to face each other, a gas is excited into plasma by electric field energy of the high frequency power, and a microprocess is performed on a target object by the generated plasma. Such a parallel plate type plasma processing apparatus has been mainly used for performing, for example, an etching process.

In the parallel plate type plasma processing apparatus, a processing gas is introduced into a processing chamber in which the upper electrode and the lower electrode are provided. The high frequency power is applied to at least one of the electrodes to generate plasma of the processing gas and then, for example, an etching process is performed on the wafer.

When forming an etching hole by the etching process, a photoresist is used as an etching mask. The photoresist is negatively charged and electric charge is neutralized on an etching surface in an early stage of the etching process. If an aspect ratio is increased as the etching process is performed, positive ions are deposited on a bottom of the etching hole so that the etching surface becomes positively charged. Therefore, the positive ions greatly contributing to the etching may not straightly introduced by a repulsive force of the positive ions within the etching hole, so that a shape of the etching hole may be bent. Further, it becomes difficult, for the positive ions to reach the bottom of the etching hole, and, thus, an etching rate is decreased.

Therefore, in order to solve such problems, for example, Patent Document 1 suggests a method of performing a plasma process. That is, In Patent Document 1, a plasma process is performed by alternately ON/OFF controlling the application of a high frequency power to the electrode so that plasma is generated and dissipated alternately within a processing chamber. Further, a negative DC voltage is applied to the upper electrode such that an application voltage during a period when the application of the high frequency power is OFF is higher than an application voltage during a period when the application of the high frequency power is ON.

In accordance with this method, the negative DC voltage is applied during the period when the application of the high frequency power is OFF, so that more secondary electrons can be generated and introduced into the etching hole with great acceleration. Therefore, a lot of secondary electrons and negative ions can be supplied into a contact hole during the period when the application of the high frequency power is OFF. As a result, the positive electric charges within the contact hole can be neutralized. Thus, when a high frequency power supply is turned on to generate plasma, positive ions can be straightly introduced into the etching hole and the good etching process can be performed.

Patent Document 1: Japanese Patent Laid-open Publication No. 2010-219491

Recently, as semiconductor devices become miniaturized, it is necessary to form an etching hole having a high aspect ratio. When the etching hole having a high aspect ratio is formed, a negative DC voltage applied during a high frequency power-off period needs to be higher.

However, if a higher negative DC voltage is applied, abnormal electric discharge may occur at a vicinity of the upper electrode and reaction products generated by the abnormal electric discharge may fail on an upper surface of a wafer. Therefore, a production yield of a semiconductor device may be decreased. The abnormal electric discharge will be explained below.

FIG. 9 is a longitudinal cross sectional view schematically illustrating a conventional configuration of an upper electrode and its vicinity in a plasma processing apparatus configured to perform the above-described etching process. As depicted in FIG. 9, an upper electrode 200 includes an electrode plate 201 provided to face a wafer and an electrode supporting member 202 configured to support the electrode plate 201. The electrode plate 201 is made of a semiconductor such as silicon, and the electrode supporting member 202 is made of a conductor such as aluminum. Above the electrode supporting member 202, a grounding member 204 made of a conductor is provided to face the electrode supporting member 202 in parallel with each other via a cylindrical insulating member 203. Within the electrode supporting member 202, there is provided a gas diffusion room 211 communicating with gas supply openings 210 formed at the electrode prate 201. A processing gas is supplied into the gas diffusion room 211 through a gas flow path 212 formed within the insulating member 203. A DC power supply 220 is electrically connected to the upper electrode 200 and the grounding member 204 such that the upper electrode 200 is a negative pole and the grounding member 204 is a positive pole.

Conventionally, in this plasma processing apparatus, a negative DC voltage of, for example, about 300 V is applied to the upper electrode 200. Although there is no problem in this case, the present inventor has found that when the negative DC voltage to be applied is increased to, for example, about 1200 V in order to further accelerate secondary electrons and ions, electric discharge occurs between the electrode supporting member 202 constituting the upper electrode 200 as the negative pole and the grounding member 204 as the positive pole via the gas flow path 212. Therefore, there is required a method for preventing electric discharge from occurring even when a higher DC voltage is applied as compared to a conventional case.

BRIEF SUMMARY OF THE INVENTION

In view of the foregoing, illustrative embodiments provide a plasma processing apparatus that includes an upper electrode and a lower electrode and is capable of preventing electric discharge from occurring even when a higher DC voltage is applied to she upper electrode as compared to a conventional case.

In accordance with one aspect of illustrative embodiments, there is provided a plasma processing apparatus that excites a processing gas into plasma by applying a high frequency power between an upper electrode and a lower electrode provided within a processing chamber and performs a plasma process on a target object with the plasma. The plasma processing apparatus includes a grounding member provided above the upper electrode via an insulating member; and a DC power supply configured to apply a negative DC voltage to the upper electrode. Further, a gas diffusion room communicating with a gas supply opening formed at a lower surface of the upper electrode is formed in the upper-electrode and a gas flow path communicating with the gas diffusion room is formed in the insulating member. Furthermore, a bent portion configured to allow a gas flowing through the gas flow path to flow in a direction having at least a horizontal component is formed at the gas flow path such that one end portion of the gas flow path cannot be seen from the other end portion of the gas flow path when viewed from the top.

A voltage that generates electric discharge between the electrodes parallel with each other is determined by multiplying a distance between the electrodes and a gas pressure between the electrodes according to Paschen's law. The present inventor has found that it the distance between the electrodes, i.e., a length of a gas flow path, is increased, the voltage that generates electric discharge is increased. That is, even if a high voltage is applied, it is possible to prevent electric discharge from occurring. The present disclosure is based on the foregoing finding. In accordance with the illustrative embodiment, at the gas flow path formed within the insulating member provided between the upper electrode and the grounding member, the bent portion configured to allow a gas flowing through the gas flow path to flow in a direction having at least a horizontal component is provided such that one end portion of the gas flow path cannot be seen from the other end portion of the gas flow path when viewed from a top. Therefore, the length of the gas flow path can be increased as compared with a conventional configuration in which a gas flow path is linearly formed between an upper electrode and a grounding member. Thus, the distance between the electrodes as one of determination factors (including the distance between one electrodes and the gas pressure between the electrodes) of an electric discharge voltage can be substantially increased. Therefore, it is possible to prevent electric discharge caused by applying a DC voltage from occurring.

Further, if the length of the gas flow path is increased, a pressure loss of the processing gas in the gas flow path is also increased. As a result, the gas pressure between the electrodes is increased, so that it is possible to prevent electric discharge caused by applying a DC voltage from occurring.

The above-described bent portion is formed such that the one end pore ion of the gas flow path, cannot be seen from the other end portion of the gas flow path, when viewed, from the top, and, thus, the bent portion may serve as an obstructing member. Therefore, linear electric discharge does not occur between the upper electrode and the grounding member unlike the conventional configuration. With this configuration, it is possible to prevent electric discharge caused by applying a DC voltage from occurring.

The bent portion at the gas flow path may have a spiral shape from the one end portion of the gas flow path toward the other end portion of the gas flow path. Further, the bent portion at the gas flow path may be formed by providing, within the gas flow path, a flow rectifying member configured to obstruct a straight movement of the processing gas within the gas flow path. Furthermore, a driving unit may be configured to move the flow rectifying member within the gas flow path.

A barrier portion may be configured to increase a resistance between the gas supply opening and the gas diffusion room may be formed between the gas supply opening and the gas diffusion room.

The upper electrode may include an electrode plate facing the target object and an electrode supporting member provided on an upper surface of the electrode plate, and the barrier portion may be formed at the electrode supporting member. Further, the upper electrode may include an electrode plate facing the target object and an electrode supporting member provided on an upper surface of the electrode plate, and the barrier portion may be formed at the electrode plate.

In accordance with the illustrative embodiments, the plasma processing apparatus including the upper electrode and the lower electrode is capable of preventing electric discharge from occurring when a DC voltage is applied to the upper electrode.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 6 is a longitudinal cross sectional view schematically illustrating a configuration of the upper electrode and its vicinity in accordance with still another illustrative embodiment;

FIG. 7 is an explanatory diagram illustrating a status where a barrier portion is formed at the upper electrode;

FIG. 8 is an explanatory diagram illustrating a status where a barrier portion is formed at the upper electrode.

DETAILED DESCRIPTION OF THE INVENTION

Figure 1:
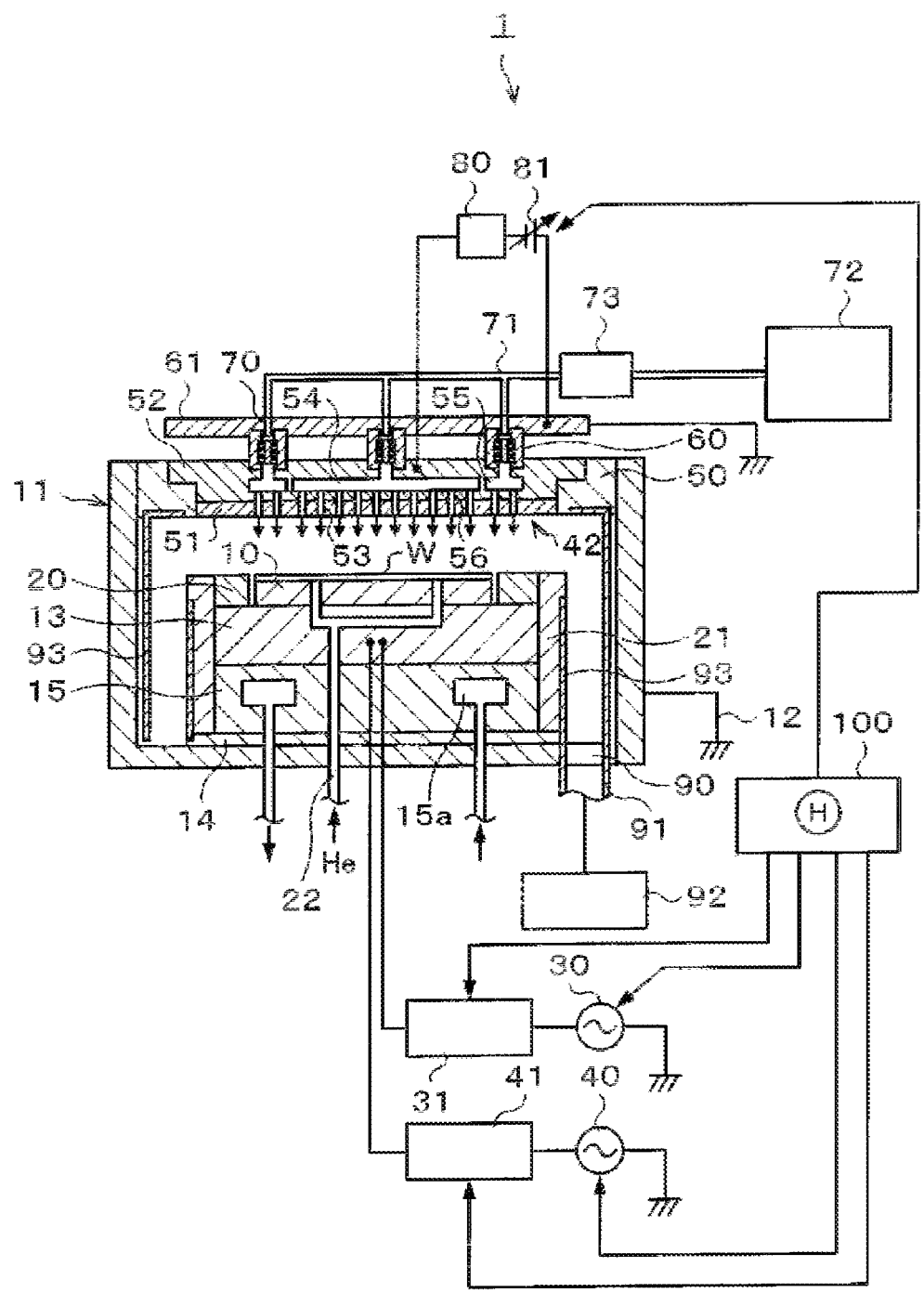
FIG. 1 is a longitudinal cross sectional view schematically illustrating a configuration example of a plasma processing apparatus in accordance with an illustrative embodiment.

Hereinafter, illustrative embodiments will be described with reference to the accompanying drawings. FIG. 1 is a longitudinal cross sectional view schematically illustrating a configuration of a plasma processing apparatus 1 in accordance with an illustrative embodiment. The plasma processing apparatus 1 in accordance with the present illustrative embodiment is, for example, a parallel plate type plasma etching apparatus.

The plasma processing apparatus 1 includes a substantially cylindrical processing chamber 11 in which a wafer chuck 10 configured to hold a wafer W as a silicon substrate is provided. The processing chamber 11 is electrically connected and grounded to a ground line 12. Within the wafer chuck 10, an electrode (not illustrated) is provided and the wafer W can be attracted to and held on the wafer chuck 10 by an electrostatic force generated by applying a DC voltage to the electrode.

A lower surface of the wafer chuck 10 is supported on a susceptor 13 serving as a lower electrode. The susceptor 13 has a substantially disc shape and is made of metal such as aluminum. At a bottom portion of the processing chamber 11, a supporting table 15 is provided via an insulating plate 14. The susceptor 13 is supported on an upper surface of the supporting table 15.

A conductive correction ring 20 that is made of, for example, silicon and configured to improve uniformity in a plasma process is provided at an outer periphery of the wafer chuck 10 supported on an upper surface of the susceptor 13. Outer surfaces of the susceptor 13, the supporting table 15, and the correction ring 20 are surrounded by a cylindrical member 21 made of, for example, quartz.

Within she supporting table 15, a coolant path 15a through which a coolant flows is formed in, for example, a circular ring shape. By controlling a temperature of a coolant supplied into the coolant path 15a, a temperature of the wafer W held on the wafer chuck 10 can be adjusted. Further, a heat transfer gas line 22 that supplies a heat transfer gas such as a helium gas between the wafer chuck 10 and the wafer W held on the wafer chuck 10 is formed through, for example, the susceptor 13, the supporting table 15, and the insulating plate 14.

The susceptor 13 is electrically connected to a first high frequency power supply 30, which is configured to supply a high frequency power to the susceptor 13 to generate plasma, via a first matching unit 31. The first high frequency power supply 30 is configured to supply a high frequency power of, from about 27 MHz to about 100 MHz, and for example, about 40 MHz in the present illustrative embodiment. The first matching unit 31 is configured to match a load impedance with an inner impedance of the first high frequency power supply 30. When plasma is generated within the processing chamber 11, the inner impedance of the first high frequency power supply 30 becomes apparently matched with one load impedance by the first matching unit 31.

Further, the susceptor 13 is electrically connected to a second high frequency power supply 40, which is configured to supply a high frequency power to the susceptor 13 and to apply a bias to the wafer W to introduce ions into the wafer W, via a second matching unit 41. The second high frequency power supply 40 is configured to supply a high frequency power of, from about 400 kHz to about 13.56 MHz, and for example, about 3.2 MHz in the present illustrative embodiment. The second matching unit 41 is configured to match a load impedance with an inner impedance of the second high frequency power supply 40 in the same manner as the first matching unit 31.

Above the susceptor 13 serving as the lower electrode, an upper electrode 42 is provided to face the susceptor 13 in parallel with each other. The upper electrode 42 is supported by an upper portion of the processing chamber 11 via an insulating shielding member 50. The upper electrode 42 includes an electrode plate 51 facing the wafer W held on the wafer chuck 10 and an electrode supporting member 52 supporting the electrode plate 51 from an upper side thereof. The electrode plate 51 includes multiple gas supply openings 53 through which a processing gas is supplied into the processing chamber 11. The multiple gas supply openings 53 are formed through the electrode plate 51. The electrode plate 51 is made of, for example, a low resistant conductor or semiconductor having a low Joule heat, for example, silicon in the present illustrative embodiment. The electrode supporting member 52 is made of a conductor, for example, aluminum in the present illustrative embodiment.

The upper electrode 42 is electrically connected to a DC power supply 81 via a low pass filter 30 that traps high frequency power from the first high frequency power supply 30 and the second high frequency power supply 40. The DC power supply 81 is electrically connected to the upper electrode 42 such that the upper electrode 42 is a negative pole and a grounding member 61 is a positive pole. Thus, a negative DC voltage can be applied to the upper electrode 42. In the present illustrative embodiment, the negative DC voltage is about 1200 V.

The first high frequency power supply 30, the first matching unit 31, the second high frequency power supply 40, the second matching unit 41, and the DC power supply 81 are connected to a controller 100 to be described later, and operations of these components are controlled by the controller 100.

At a central portion within the electrode supporting member 52, a substantially disc-shaped gas diffusion room 54 is formed. Outside the gas diffusion room 54, a circular ring-shaped gas diffusion room 55 is further formed. At a lower portion of the electrode supporting member 52, multiple gas holes 56 downwardly extended from the gas diffusion rooms 54 and 55 are formed. The gas supply openings 53 are connected to the gas diffusion rooms 54 and 55 via the gas holes 56. Further, the gas diffusion room 54 is separately formed from the gas diffusion room 55 in order to respectively control inner pressures of the gas diffusion rooms 54 and 55 and in order to independently control flow rates of processing gases supplied from the gas holes 56 near the center of the electrode supporting member 52 and the gas holes 56 near an outer periphery of the electrode supporting member 52. A shape and arrangement of the diffusion rooms 54 and 55 are not limited to the present illustrative embodiment.

Above the electrode supporting member 52, the substantially disc-shaped grounding member 61 is provided to face the electrode supporting member 52 in parallel with each other via a substantially cylindrical insulating member 60. The grounding member 61 is made of a conductor, for example, aluminum in the present illustrative embodiment.

Figure 2:
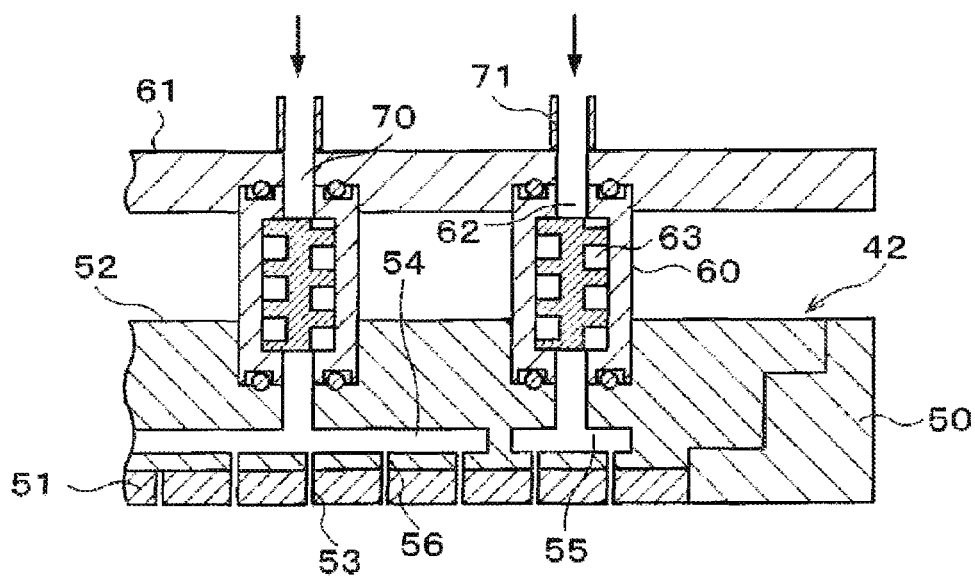
FIG. 2 is a longitudinal cross sectional view schematically illustrating a configuration of an upper electrode and its vicinity in accordance with the illustrative embodiment.

A gas flow path 62 communicating with the gas diffusion rooms 54 and 55 is formed within the insulating member 60, as depicted in FIG. 2. At the gas flow path 62, a bent portion 63 is formed such that one end portion of the gas flow path 62 at a side of the electrode supporting member 52 cannot be seen from the other end portion of the gas flow path 62 at a side of the grounding member 61 via the gas flow path 62 when viewed from the top. Further, the bent portion 63 is configured to allow a gas passing through the gas flow path 62 to flow in a direction having at least a horizontal component. By way of example, in the present illustrative embodiment, the bent portion 63 is formed such that the gas flows in a spiral shape from the end portion of the gas flow path 62 at the side of the grounding member 61 toward the other end portion of the gas flow path 62 at the side of the electrode supporting member 52 as depicted in FIG. 2. The direction having the horizontal component includes all directions such as a upwardly incline direction or a downwardly incline direction except only a vertical direction as well as a horizontal direction.

Figure 9:
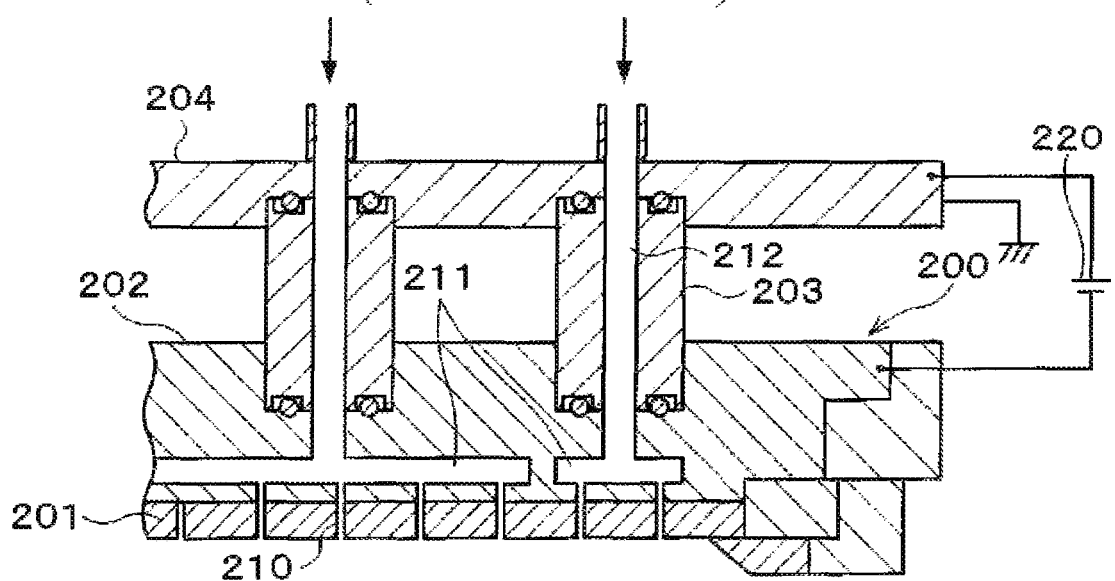
FIG. 9 is a longitudinal cross sectional view schematically illustrating a conventional configuration of the upper electrode and its vicinity.

Since the bent portion 63 is formed at the gas flow path 62, a length of the gas flow path 62 can be increased as compared with a case where the gas flow path 212 is straightly provided in the conventional insulating member 203 as depicted in FIG. 9. In the present illustrative embodiment, the bent portion 63 is formed such that the length of the gas flow path 62 can be about three times the length of the gas flow path 212 of the conventional insulating member 203. In general, an electric discharge voltage may be determined depending on a distance between the electrodes and a gas pressure between the electrodes (determination factors). Due to the bent portion 63, the distance between the electrodes (i.e., the gas flow path 62 between the grounding member 61 and the upper electrode 42), which is one of the determination factors, can be lengthened. Thus, the bent portion 63 may prevent the electric discharge caused by applying the DC voltage from occurring. Further, the length of the gas flow path 62 may be selectively determined in a range where the electric discharge does not occur, based on a relationship between pressures within the gas diffusion rooms 54 and 55 and a DC voltage to be applied. Accordingly, the length of the gas flow path 62 is not limited to the present illustrative embodiment.

Since the bent portion 63 is formed, the end portion of the gas flow path 62 cannot be seen from the other end portion of the gas flow path 62 when viewed from the top. Therefore, the bent portion 63 serves as an obstructing member that prevents the electric discharge from straightly occurring between the upper electrode 42 and the grounding member 61. Accordingly, it is possible to more securely prevent the electric discharge caused by applying the DC voltage from occurring.

At a position corresponding to the gas flow path 62 in the grounding member 61, a gas inlet opening 70 is formed through the grounding member 61. The gas inlet opening 70 is connected to a gas supply line 71. The gas supply line 71 is connected to a processing gas supply source 72 as depicted in FIG. 1. A processing gas supplied from the processing gas supply source 72 is supplied to the gas diffusion rooms 54 and 55 through the gas supply line 71 and the gas flow path 62. The processing gas supplied to the gas diffusion rooms 54 and 55 is introduced into the processing chamber 11 through the gas holes 56 and the gas supply openings 53. That is, the upper electrode 42 serves as a shower head that supplies the processing gas into the processing chamber 11. As the processing gas, various gases conventionally used in the plasma etching may be employed. For example, a fluorocarbon gas such as $C_4F_8$ may be used or the processing gas may contain other gases such as Ar or $O_2$.

At the gas supply line 71, a flow rate control, unit 73 configured to control an amount of a gas to be supplied to the gas diffusion rooms 54 and 55 from the processing gas supply source 72 is provided. The flow rate control unit 73 may include, for example, a mass flow controller and a valve.

At a bottom surface of the processing chamber 11, there is provided an exhaust opening 90. The exhaust opening 90 is connected to an exhaust unit 92 via an exhaust line 91. By operating the exhaust unit 92, an atmosphere within the processing chamber 11 can be depressurized to a preset vacuum level. Further, an inner wall of the processing chamber 11 is covered by a liner 93 on which a thermally sprayed coating film made of a plasma resistant material is formed.

In the plasma processing apparatus 1, the controller 100 is provided as described above. The controller 100 is, for example, a computer and includes a program storage unit (not illustrated). The program storage unit stores a program for operating the plasma processing apparatus 1 by respectively controlling the power supplies 30, 40, and 81, the matching units 31 and 41, and the flow rate control, unit 73.

This program can control, for example, ON/OFF and output of the first high frequency power supply 30. Therefore, by way of example, by continuously turning on the first high frequency power supply 30, plasma may be generated continuously, or by alternately turning ON and OFF the first high frequency power supply 30 to apply a high frequency power in a pulse shape, plasma may be generated and dissipated alternately. Further, the program can control ON/OFF and output of the second high frequency power supply 40 for applying the bias in the same manner as the first high frequency power supply 30. During the plasma process, the bias can be applied continuously, or the bias can be applied in a pulse shape to be synchronized with ON/OFF of the first high frequency power supply 30. Furthermore, the program can control ON/OFF, a voltage and a current of the DC power supply 81.

Figure 3:
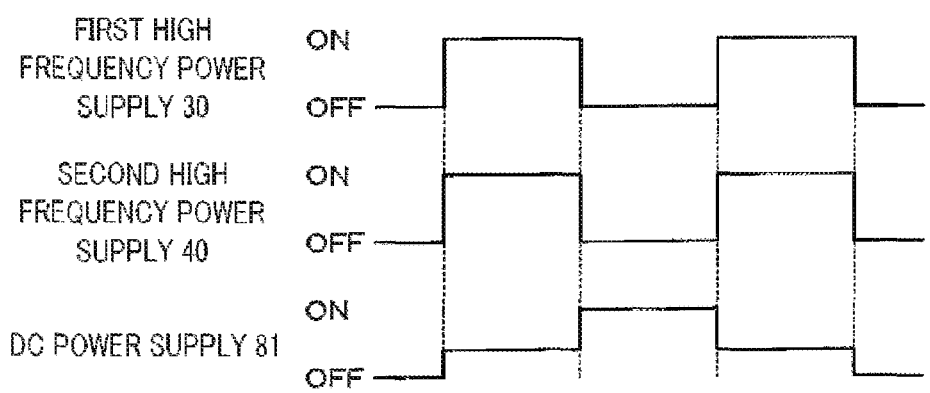
FIG. 3 is a timing chart showing an operation status of each power supply when performing a plasma process.

In the present illustrative embodiment, as depicted in FIG. 3, the second high frequency power supply 40 is turned ON and OFT alternately to be synchronized with ON/OFF of the first high frequency power supply 30, so that plasma can be generated and dissipated alternately. Further, a negative DC voltage is applied to the upper electrode 42 from the DC power supply 81 to be synchronized with OH/OFF of the first high frequency power supply 30. At this time, the DC power supply 81 is controlled such that an absolute value of the applied negative DC voltage during a period when plasma is generated is higher than an absolute value of the applied negative DC voltage during a period when plasma is dissipated.

As described above, by respectively controlling the power supplies 30, 40, and 81, during a period when the power supplies 30 and 40 are turned ON, a plasma sheath formed by the first high frequency power supply 30 is overlapped with a plasma sheath formed by the second high frequency power supply 40, so that a thick plasma sheath is formed. As a result, during the period when the power supplies 30 and 40 are turned ON, electrons are reflected from the plasma sheath, but during a period when the power supplies 30 and 40 are turned OFF, the plasma sheath is dissipated and secondary electrons can easily reach the wafer W.

In the meantime, the negative DC voltage is applied from the DC power supply 81 such that an absolute value of the negative DC voltage during the period when plasma is dissipated is higher than an absolute value of the negative DC voltage during the period when plasma is generated. As a result, a lot of electrons can be supplied to the surface of the wafer W during the period when the power supplies 30 and 40 are turned OFF. Therefore, electric charges positively charged within a contact hole can be neutralized. Thus, when the high frequency power supply is turned ON to generate plasma, positive ions can be straightly introduced within the etching hole and the good etching process can be performed.

The above-described program is stored in a computer-readable storage medium H such as a computer-readable hard disk (HD), a flexible disc (FD), a compact disc (CD), a magnet optical disc (MO), and a memory card. The program may be installed in the controller 100 from the storage medium H.

The plasma processing apparatus 1 in accordance with the present illustrative embodiment is configured as described above. Hereinafter, there will be explained a plasma etching process by the plasma processing apparatus 1 in accordance with the present illustrative embodiment.

In the plasma processing process, the wafer W is loaded into the processing chamber 11, and mounted and held on the wafer chuck 10. Then, the processing chamber 11 is exhausted by the exhaust unit 92 while supplying a processing gas into the processing chamber 11 at a certain flow rate from the processing gas supply source 72. At this time, the flow rate of the processing gas is controlled by the flow rate control unit 73 such that a pressure within the processing chamber 11 can be in a range of, for example, from about 10 Pa to about 150 Pa.

Thereafter, high frequency powers are continuously applied to the susceptor 13 serving as the lower electrode by the first high frequency power supply 30 and the second high frequency power supply 40 while continuously applying a DC voltage to the upper electrode 42 from the DC power-supply 81. Thus, the processing gas supplied into the processing chamber 11 is excited into plasma between the upper electrode 42 and the susceptor 13.

Subsequently, the respective power supplies 30, 40, and 81 are controlled in patterns as depicted in FIG. 3. An etching process is performed on the wafer W with ions or radicals generated from the plasma within one processing chamber 11.

At this time, electric discharge caused by applying the DC voltage does not occur between the grounding member 61 and the upper electrode 42 since the bent portion 63 is formed at the gas flow path 62. Therefore, it is possible to avoid a decrease in a production yield of a semiconductor device, which is caused by reaction products failing on the wafer by the electric discharge. Accordingly, a higher negative DC voltage can be applied, and, thus, an etching hole having a high aspect ratio can be formed as compared to the conventional process.

In accordance with the above-described illustrative embodiment, at the gas flow path 62 formed within the insulating member 60 provided between the upper electrode 42 and the grounding member 61, there is provided the bent portion 63 configured to allow a gas flowing through the gas flow path 62 to flow in a direction having at least a horizontal component. With this configuration, the end portion of the gas flow path 62 cannot be seen from the other end portion thereof when viewed from the top. Therefore, the length of the gas flow path 62 can be increased as compared with the conventional configuration in which a gas flow path is straightly provided between the upper electrode and the grounding member. Thus, the distance between the electrodes (i.e., an electric distance between the upper electrode 42 and the grounding member 61), which is one of the determination factors (the distance between the electrodes and the gas pressure between the electrodes) of the electric discharge voltage, can be substantially increased without physically moving the upper electrode 42 and the grounding member 61. Therefore, even if a DC voltage higher than that of the conventional process is applied from the DC power supply 81, it is possible to prevent the electric discharge caused by applying the DC voltage from occurring.

Since the length of the gas flow path 62 is increased, a pressure loss of the processing gas in the gas flow path 62 is also increased. Therefore, a pressure difference between the both end portions of the gas flow path 62 is increased. That is, when the processing gas is supplied from the processing gas supply source 72, a pressure of the processing gas at a side of the grounding member 61 is increased. Thus, it is possible to prevent the electric discharge caused by applying a DC voltage from occurring.

Further, since the bent portion 63 is formed such that the end portion of the gas flow path 62 cannot be seen from the other end portion thereof when viewed from the top, the bent portion 63 serves as the obstructing member that prevents the electric discharge from straightly occurring between the upper electrode 42 and the grounding member 61. In accordance with the above-described illustrative embodiment, it is possible to more securely prevent the electric discharge caused by applying a DC voltage from occurring.

Figure 4:
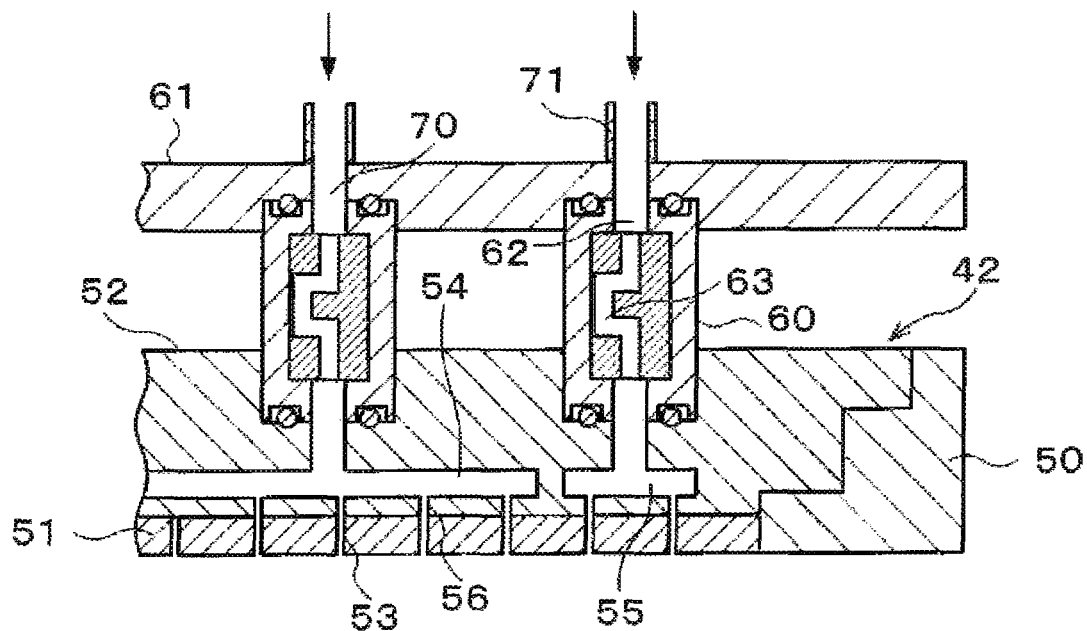
FIG. 4 is a longitudinal cross sectional view schematically illustrating a configuration of the upper electrode and its vicinity in accordance with another illustrative embodiment.
Figure 5:
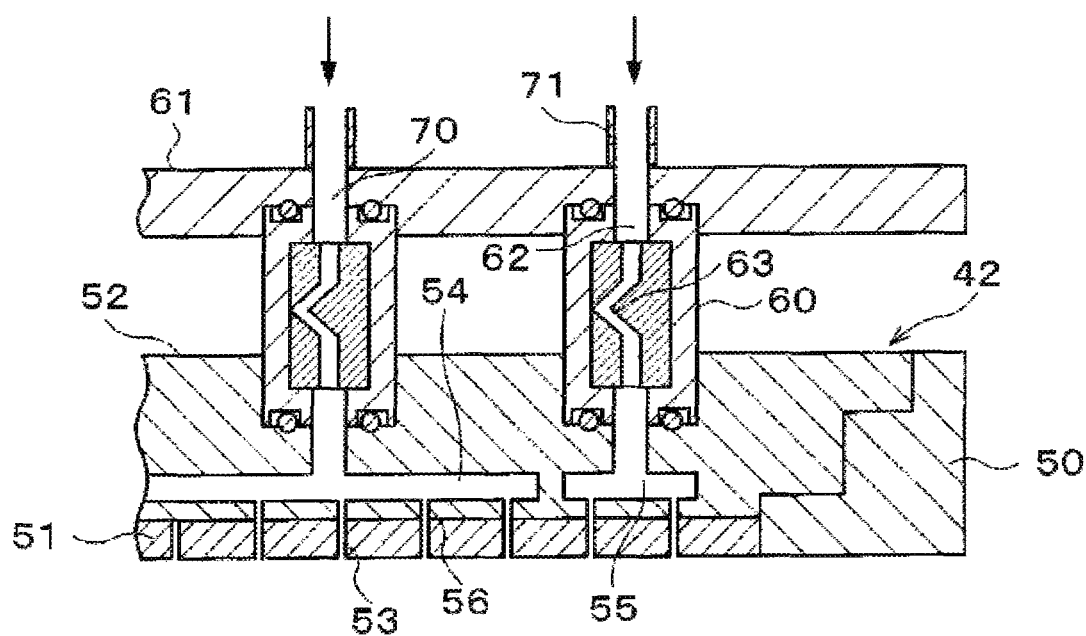
FIG. 5 is a longitudinal cross sectional view schematically illustrating a configuration of the upper electrode and its vicinity in accordance with still another illustrative embodiment.

In accordance with the above-described illustrative embodiment, the bent portion 63 formed at the gas flow path 62 has a spiral shape. However, a shape of the gas flow path 62 is not limited to the present illustrative embodiment and can have various shapes if the end portion of the gas flow path 62 cannot be seen from the other end portion thereof when viewed from the top due to the bent portion 63. To be specific, by way of example, a longitudinal cross sectional shape of the bent portion 63 may nave a substantially U shape as depicted in FIG. 4 or a substantially v shape as depicted in FIG. 5.

By way of example, as depicted in FIG. 6, a flow rectifying member 110 may be provided within the gas flow path 62 such that the end portion of the gas flow path 62 at the side of the electrode supporting member 52 cannot be seen from the end portion of the gas flow path 62 at the side of the grounding member 61 via the gas flow path 62. That is, the flow rectifying member 110 may be provided such that the processing gas cannot move straightly within the gas flow path 62 and the bent portion 63 may be formed conforming to the outer shape of the flow rectifying member 110. By way of example, the flow rectifying member 110 may be connected to a non-illustrated driving unit to be movable. Further, a vertical position or a horizontal position of the flow rectifying member 110 within the gas flow path 62 may be changed in order to control a pressure loss in the gas flow path 62 accordingly. In this case, the flow rectifying member 110 may have a shape, such as a valve body of a needle valve, desirable for controlling a pressure. In any case, it is clear to those skilled in the art that various changes and modifications may be made within a scope of the claims and it shall be understood that they are included in the scope of the present disclosure.

In accordance with the illustrative embodiment, since the bent portion 63 is formed at the gas flow path 62, the electric distance between the upper electrode 42 and the grounding member 61 is increased. As a result, the gas pressure between the electrodes, which is the other one of the determination factors of an electric discharge voltage, is also increased accordingly. By way of example, in order to securely increase the gas pressure between the electrodes, a barrier portion 120 configured to increase a pressure loss of the processing gas may be formed at the sides of the gas diffusion rooms 54 and 55.

By way of example, to be specific, as depicted in FIG. 7, a part of the gas hole 56 in the electrode supporting member 52 may be formed in an orifice shape, i.e., a circular ring-shaped protrusion portion protruding toward the center of the gas hole 56 may be formed, to form the barrier portion 120. Otherwise, by way of example, as depicted in FIG. 8, a part of the gas supply opening 53 in the electrode plate 51 may be formed in an orifice shape to form the barrier portion 120. The barrier portion 120 may be formed at both the gas hole 56 and the gas supply opening 53. If it is possible to increase the resistance between the gas diffusion rooms 54 and 55 and the gas supply opening 53, a shape and arrangement of the barrier portion 120 may be selectively set. Therefore, even if a diameter of the each gas hole 56 is decreased instead of forming protrusion portions at some gas holes 56, it can be understood that the barrier portion 120 is formed. In any case, a pressure difference between the front and the back of the barrier portion 120 is increased, and, thus, pressures within the gas diffusion rooms 54 and 55 become higher than a pressure within the processing chamber 11. As a result, a pressure of the processing gas at the gas flow path 62 provided at an upstream side of the gas diffusion rooms 54 and 55 is increased, and, thus, it is possible to prevent the electric discharge caused by applying a DC voltage from occurring.

In particular, the gas supply opening 53 in the electrode plate 51 may be damaged by being exposed to plasma within the processing chamber 11. Thus, a diameter of the gas supply opening 53 is gradually increased and a resistance at the gas hole 53 is gradually decreased as times go on. In this case, the pressures of the processing gas within the gas diffusion rooms 54 and 55 are decreased and the pressure at the gas flow path 62 is decreased accordingly. Therefore, electric discharge may occur easily. For this reason, conventionally, the electrode plate 51 needs to be replaced regularly. However, the barrier portion 120 is formed to increase a pressure loss as described in the present illustrative embodiment, so that the pressures within the gas diffusion rooms 54 and 55 can be maintained and a gradual decrease in a gas pressure can be suppressed. Thus, the number of times of replacement of the electrode plate 51 can be reduced. Further, as described above, the gas supply opening 53 in the electrode plate 51 is damaged, by being exposed to plasma within the processing chamber 11, and, thus, it is desirable to form the barrier portion 120 at position away from a lower end surface of the electrode plate 51 with a certain distance or more.

Although the illustrative embodiment has been provided above, the present disclosure is not limited thereto. It is clear to those skilled in the art that various changes and modifications may be made within a scope of the claims and it shall be understood that they are included in the scope of the present disclosure.

What is claimed is:

1. A plasma processing apparatus that excites a processing gas into plasma by applying a high frequency power between an upper electrode and a lower electrode provided within a processing chamber and performs a plasma process on a target object with the plasma, the plasma processing apparatus comprising:
   a grounding member provided above the upper electrode via an insulating member; and
   a DC power supply configured to apply a negative DC voltage to the upper electrode,
   wherein a gas diffusion room communicating with a gas supply opening formed at a lower surface of the upper-electrode is formed in the upper electrode,
   a gas flow path communicating with the gas diffusion room is formed in the insulating member, and
   a bent portion configured to allow a gas flowing through the gas flow path to flow in a direction having at least a horizontal component is formed at the gas flow path such that one end portion of the gas flow path cannot be seen from the other end portion of the gas flow path when viewed from the top.

2. The plasma processing apparatus of claim 1, wherein the bent portion at the gas flow path has a spiral shape from the one end portion of the gas flow path toward the other end portion of the gas flow path.

3. The plasma processing apparatus of claim 1, wherein the bent portion at the gas flow path is formed by providing, within the gas flow path, a flow rectifying member configured to obstruct a straight movement of the processing gas within the gas flow path.

4. The plasma processing apparatus of claim 3, further comprising:
   a driving unit configured to move the flow rectifying member within the gas flow path.

5. The plasma processing apparatus of claim 1, wherein a barrier portion configured to increase a resistance between, the gas supply opening and the gas diffusion room is formed between the gas supply opening and the gas diffusion room.

6. The plasma processing apparatus of claim 5, wherein the upper electrode includes an electrode plate facing the target object and an electrode supporting member provided on an upper surface of the electrode plate, and the barrier portion is formed at the electrode supporting member.

7. The plasma processing apparatus of claim 5, wherein the upper electrode includes an electrode plate facing the target object and an electrode supporting member provided on an upper surface of the electrode plate, and the barrier portion is formed at the electrode plate.

* * * * *

UNITED STATES PATENT AND TRADEMARK OFFICE
CERTIFICATE OF CORRECTION

| | | |
|---|---|---|
| PATENT NO. | : 9,055,661 B2 | Page 1 of 1 |
| APPLICATION NO. | : 13/743586 | |
| DATED | : June 9, 2015 | |
| INVENTOR(S) | : Kiyoshi Tanaka | |

It is certified that error appears in the above-identified patent and that said Letters Patent is hereby corrected as shown below:

In the specification,

Column 6, line 12, please replace "30" with -- 80 --

Column 8, line 22, please replace "OFT" with -- OFF --

Column 8, line 26, please replace "OH" with -- ON --

Signed and Sealed this
Tenth Day of November, 2015

Michelle K. Lee
*Director of the United States Patent and Trademark Office*